(12) United States Patent
Dong et al.

(10) Patent No.: US 6,664,151 B2
(45) Date of Patent: Dec. 16, 2003

(54) METHOD FOR MANUFACTURING A THIN FILM TRANSISTOR USING STEAM ANNEAL PROCESS TO REINFORCE THE SURFACE OF THE ONO LAYER

(75) Inventors: Cha-deok Dong, Gyunggi-Do (KR); Se-ho Park, Seoul (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 0 days.

(21) Appl. No.: 10/234,064

(22) Filed: Sep. 3, 2002

(65) Prior Publication Data

US 2003/0109087 A1 Jun. 12, 2003

(30) Foreign Application Priority Data

Sep. 4, 2001 (KR) ........................................ 2001-54177

(51) Int. Cl.[7] .............................................. H01L 21/336
(52) U.S. Cl. ........................ 438/158; 438/159; 438/166; 438/287; 438/591; 438/261
(58) Field of Search ................................. 438/261, 158, 438/159, 166, 287, 591, FOR 200

(56) References Cited

U.S. PATENT DOCUMENTS

| 5,403,786 A | 4/1995 | Hori |
| 5,882,993 A | 3/1999 | Gardner et al. |
| 5,891,809 A | 4/1999 | Chau et al. |
| 6,063,666 A | 5/2000 | Chang et al. |

*Primary Examiner*—George Fourson
*Assistant Examiner*—Thanh Pham
(74) *Attorney, Agent, or Firm*—Marshall, Gerstein & Borun LLP

(57) ABSTRACT

Disclosed is a method for manufacturing a thin film transistor of a semiconductor device, wherein an offset area is influenced by a gate voltage to increase the ON-current, which provides a thin film transistor which improves the ON/OFF characteristic of the semiconductor device. The low swing value and the high ON/OFF ratio are implemented by forming a gate insulation layer of ONO structure on the gate electrode on the semiconductor device and then performing a steam anneal process using a wet-oxidizing method to reinforce the surface the respective ONO layer. Thus, the thickness of a gate insulation layer is reduced, the margin of the device is secured, and the electrical characteristic becomes superior.

21 Claims, 3 Drawing Sheets

METHOD FOR MANUFACTURING A THIN FILM TRANSISTOR USING STEAM ANNEAL PROCESS TO REINFORCE THE SURFACE OF THE ONO LAYER

BACKGROUND

1. Technical Field

Methods of manufacturing thin film transistors for semiconductor devices are disclosed wherein an offset area is influenced by a gate voltage to increase the ON-current, which provides a thin film transistor which improves the ON/OFF characteristic of the resulting semiconductor device and, whereby the thickness of a gate insulation layer is reduced, the margin of the device is secured, and the electrical characteristic is superior.

2. Description of the Related Art

The Thin Film Transistor TFT is generally used for manufacturing semiconductor devices such as Static Random Access Memory SRAM devices and Liquid Crystal Displays LCDs. As the integrity of semiconductor devices increases, the operational characteristics of the device depend on the operational characteristics of the thin film transistor.

The SRAM developed recently uses a p-channel poly-silicon thin film transistor as a bottom gate that is a pull-up device, and the thickness of the gate of the thin film transistor has to be reduced according to the recent trend of increased integrity in semiconductor devices which in turn requires a reduction in the operation voltage thereof.

FIG. 1 is a sectional view for illustrating a conventional method for manufacturing a thin film transistor of a semiconductor device. As shown in FIG. 1, a gate electrode 2, a gate insulation layer 3 and a channel area 4 are formed consecutively on the semiconductor substrate 1, to manufacture a thin film transistor.

The gate electrode 2 is formed by patterning a layer that is manufactured by depositing an n-type doped amorphous silicon, or by depositing an undoped poly-silicon and then doping with n-type impurities.

The gate insulation layer 3 is formed by depositing oxide on the gate electrode 2, by a chemical vapor deposition based on a silane (DCS: $SiH_2Cl_2$), and the channel area 4 is formed by depositing poly-silicon on the gate insulation layer 3.

However, according to the conventional art, the gate insulation layer 3 formed by the oxide based on the silane (DCS: $SiH_2Cl_2$) has a high swing value, and therefore, there are problems in that the ON-current is small and the ON/OFF ratio can be satisfied only marginally.

Accordingly, as the thickness of the gate insulation layer 3 is reduced, the electrical property required for the operation of the device cannot be secured.

SUMMARY OF THE DISCLOSURE

To overcome the above-described problems, a method for manufacturing a thin film transistor with a reduced gate insulation layer thickness is disclosed. Using the disclosed method, the margin of the device is secured, and the electrical characteristic becomes superior, as a low swing value and a high ON/OFF ratio are implemented by forming a gate insulation layer of ONO structure on the gate electrode on the semiconductor device and then performing a steam anneal process using a wet-oxidizing method to reinforce the surface of the respective ONO layer.

A disclosed method for manufacturing a thin film transistor of a semiconductor device comprises: forming a gate electrode, after forming an insulation layer on a semiconductor substrate having a certain lower construction; performing a first pre-treatment cleaning process to a resulting structure, and then forming a gate insulation layer of ONO structure; performing a steam anneal process on the result formed with the gate insulation layer; removing the gate insulation layer around a node area of the semiconductor device by performing a masking and an etching processes; performing a second pre-treatment cleaning process on the result, and then forming a channel area on a remaining area excluding the node area; performing an SPG anneal process on the channel area, and performing a light oxidation for a surface treatment of the channel area by In-Situ; and performing a threshold voltage ion injection on the entire channel area, and then performing LDO ion injection and source/drain ion injection consecutively using respective masks on the channel area to form a pull-up transistor.

Another disclosed method for manufacturing a thin film transistor of a semiconductor device comprises: forming a gate electrode after forming an insulation layer on a semiconductor substrate having a certain lower construction; performing a first pre-treatment cleaning process to a resulting structure, and then forming a lower oxidation layer; forming a nitride layer on the lower oxidation layer; forming an upper oxidation layer on the nitride layer to form a gate insulation layer comprised of the lower oxidation layer, the nitride layer and the upper oxidation layer; performing a steam thermal process using a wet-oxidation method on the result formed with the gate insulation layer; removing the gate insulation layer around a node area of the semiconductor device by performing a masking and an etching processes; performing a second pre-treatment cleaning process on the result, and then forming a channel area on a remaining area excluding the node area; performing an SPG anneal process on the channel area, and performing a light oxidation for a surface treatment of the channel area by In-Situ; and performing a threshold voltage ion injection on the entire channel area, and then performing LDO ion injection and source/drain ion injection consecutively using respective masks on the channel area to form a pull-up transistor.

According to the disclosed methods, as a low swing value and a high ON/OFF ratio are implemented by forming a gate insulation layer of ONO structure on the gate electrode on the semiconductor device and then performing a steam anneal process using a wet-oxidizing method to reinforce the surface of the respective ONO layer, the thickness of the gate insulation layer is reduced.

BRIEF DESCRIPTION OF THE DRAWINGS

Other objects and aspects of the disclosed methods and devices will become apparent from the following description of embodiment with reference to the accompanying drawings in which.

DESCRIPTION OF THE PRESENTLY PREFERRED EMBODIMENT

Hereinafter, the disclosed methods will be described in greater detail and with reference to the drawings.

Figure 1:
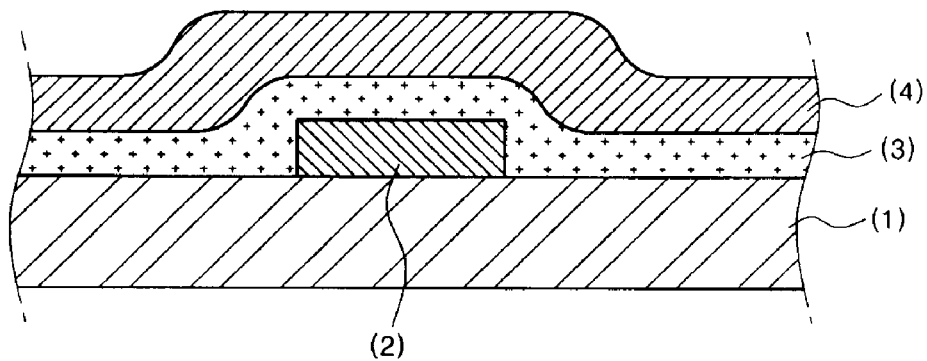
FIG. 1 is a sectional view illustrating a conventional method for manufacturing a thin film transistor of a semiconductor device.
Figure 2A:
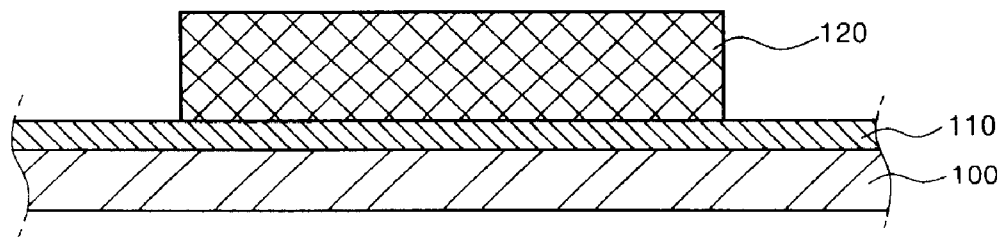
FIGS. 2A through 2E are sectional views consecutively illustrating a disclosed method for manufacturing a thin film transistor of a semiconductor device.

FIGS. 2A through 2E are sectional views consecutively illustrating a disclosed method for manufacturing a thin film transistor of a semiconductor device. As shown in FIG. 2A, an insulation layer 110 is formed on a semiconductor substrate 100 having bulk transistors, bit lines, etc., by using a thin film made of an oxidation layer, and then a gate electrode 120 is formed.

The gate electrode 120 is formed by using a doped poly-silicon made from a mixture of a silicon source gas and $PH_3$ gas, with an LP-CVD method, to a thickness ranging from about 500 to about 1500 Å at a temperature ranging from about 550 to about 620° C. and under a pressure ranging from about 0.1 to about 3 torr.

Furthermore, the gate electrode 120 is formed by an over-etching to a depth less than half of the thickness of the lower insulation layer 110, so as to prevent an undercut due to an excessive loss of the lower insulation layer 110.

Then, a first pre-treatment cleaning process is performed by using DHF solution that is a mixture of HF and $H_2O$ diluted to a ratio ranging from about 50:1 to about 100:1, and SC-1 solution, in order to prevent the generation of a natural oxidation layer, and to remove the particles.

Figure 2B:
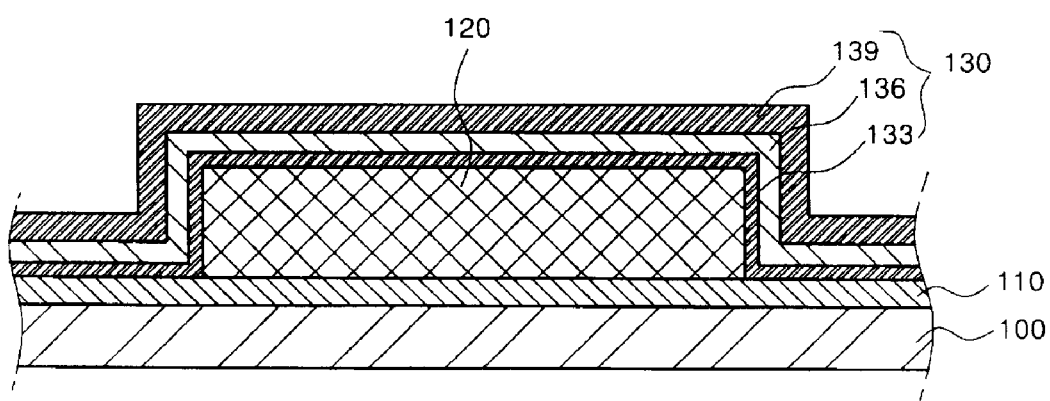

Then, as shown in FIG. 2B, a gate insulation layer 130 is formed by forming a lower oxidation layer 133, a nitride layer 136, and an upper oxidation layer 39 consecutively to a ratio of thickness (A) in the range of 35~65:40~65:65~100, on the entire semiconductor substrate formed with the gate electrode 120.

The lower oxidation layer 133 and the upper oxidation layer 139 among the gate insulation layers 130 are formed using a thermal oxidation layer which uses $N_2O$ gas and DCS ($SiH_2Cl_2$) gas having a superior duration voltage and Time Dependent Dielectric Breakdown TDDB characteristic as sources, with the LP-CVD method under a pressure ranging from about 0.1 to about 0.5 torr and at a temperature ranging from about 810 to about 850° C. And, the nitride layer 136 is formed by the LP-CVD method using DCS gas and $NH_3$ gas as sources.

Moreover, the upper oxidation layer 139 is formed to be thicker than the lower oxidation layer 133, in order to secure a recess margin for the following second pre-treatment cleaning process.

Then, a steam anneal process is performed on the entire result formed with the gate insulation layer 130, by a wet-etching method at a temperature ranging from about 750 to about 790° C., in order to improve the characteristic of each ONO layer and reinforce the interface thereof.

After that, the gate insulation layer around the node area on the semiconductor device is removed by a masking and an etching processes, and then the second pre-treatment cleaning process is performed by using PIRANHA ($H_2SO_4$/$H_2O_2$) and HF to remove the pollution and the gate insulation layer (not shown) which was damaged during the etching process.

Figure 2C:
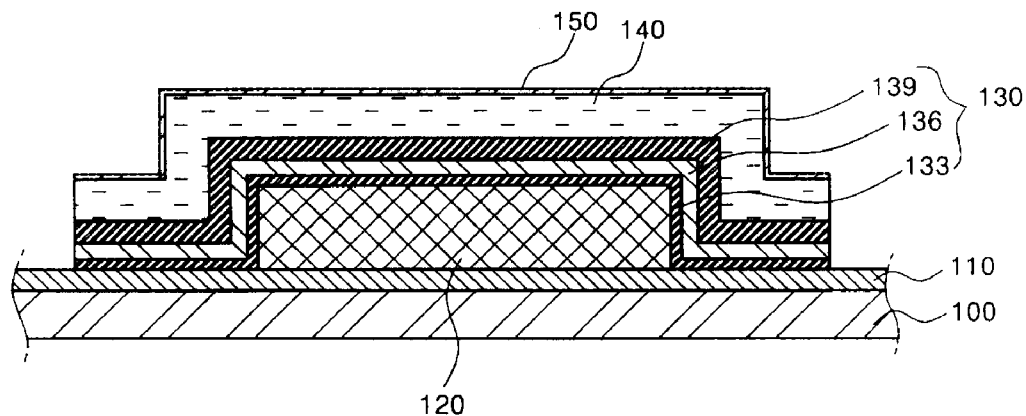

Then, as shown in FIG. 2C, a channel area 140 is formed on the gate insulation layer 120 by an undoped amorphous silicon layer, using $Si_2H_6$ as a source gas, to a thickness ranging from about 250 to about 1000 Å, with the LP-CVD method at a temperature ranging from about 460 to about 500° C. and under a pressure ranging from about 0.1 to about 2 torr.

An SPG anneal process is performed on the upper side of the channel area 140 for a time period ranging from about 3 to about 6 hours at a temperature ranging from about 620 to about 670° C. in $N_2$ atmosphere by In-Situ, and a light oxidation process is performed by flowing $O_2$ gas by dry method at a temperature ranging from about 750 to about 830° C., to perform a surface treatment 150.

After that, threshold voltage Vt ions (not shown) are injected into the entire channel area 140 to a dose amount ranging from about $1\times10^{11}$ to about $1\times10^{13}$ ions/cm$^2$, by using P at a power ranging from about 10 to about 50 keV.

Figure 2D:
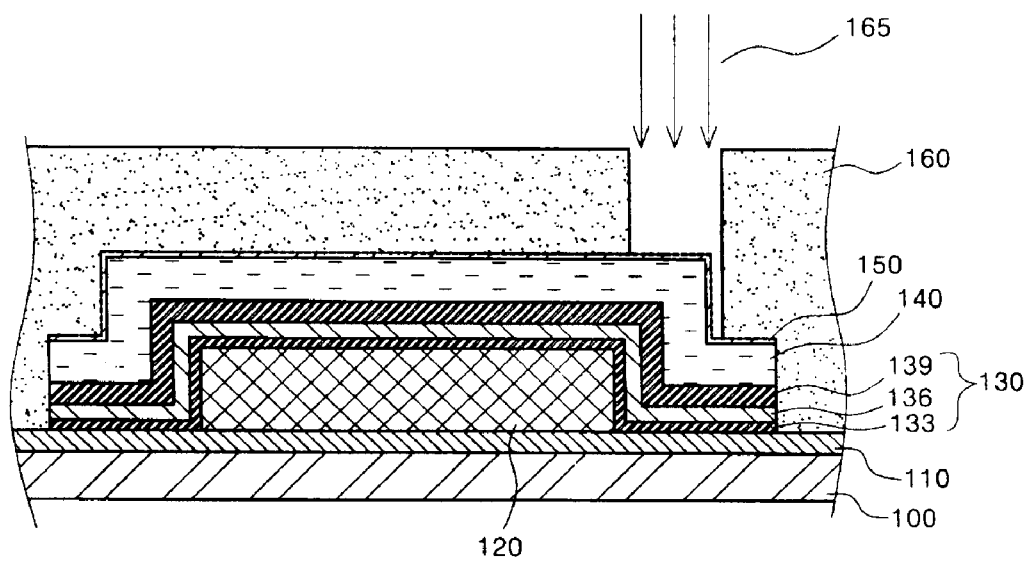

As shown in FIG. 2D, after a first mask 160 is formed on the channel area 140, an LDO ion injection 165 is performed using the first mask 160 to a dose amount ranging from about $1\times10^{11}$ to about $1\times10^{13}$ ions/cm$^2$, by using $BF^2$ as a source at a power ranging from about 10 to about 50 keV.

Figure 2E:
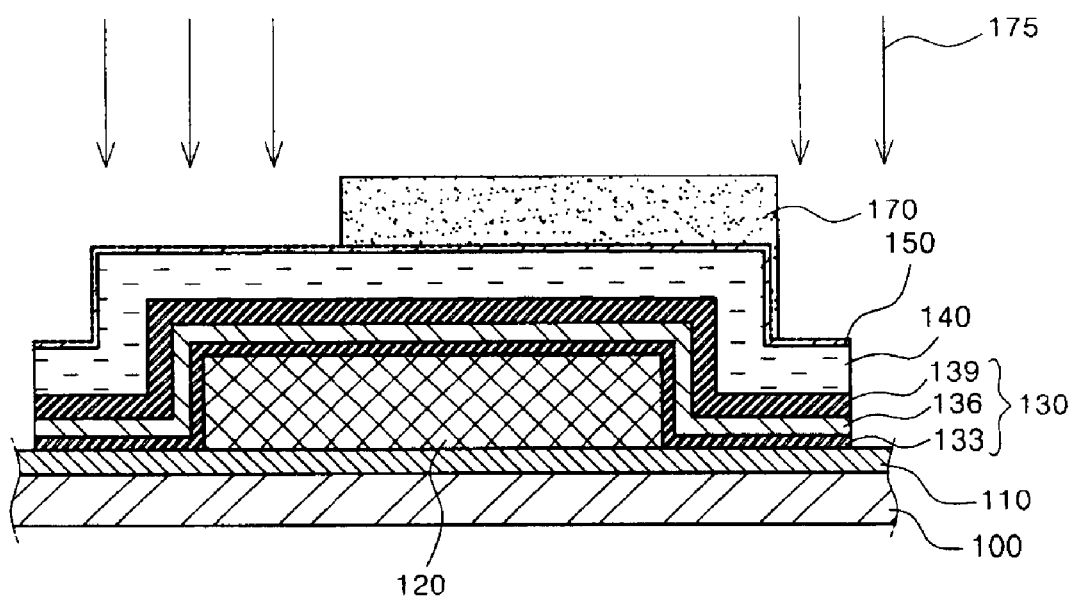

Then, as shown in FIG. 2E, after removing the first mask 160 and forming a second mask 170, a source/drain ion injection 175 is performed using the second mask 170 to a dose amount ranging from about $1\times10^{14}$ to about $1\times10^{15}$ ions/cm$^2$, by using $BF^2$ as a source at a power ranging from about 10 to about 50 keV.

After that, a pull-up transistor is formed by removing the second mask 170.

According to the method for manufacturing a thin film transistor of a semiconductor device, as a low swing value and a high ON/OFF ratio are implemented by forming a gate insulation layer of ONO structure on the gate electrode on the semiconductor device and then performing a steam anneal process of wet-oxidizing method to reinforce the surface the respective ONO layer, the thickness of a gate insulation layer is reduced, the margin of the device is secured, and the electrical characteristic becomes superior.

Although a preferred embodiment has been described, it will be understood by those skilled in the art that this disclosure should not be limited to the described preferred embodiment, but various changes and modifications can be made within the spirit and the scope of this disclosure. Accordingly, the scope of this disclosure is not limited within the described range but by the following claims.

What is claimed is:

1. A method for manufacturing a thin film transistor of a semiconductor device, comprising:

forming a gate electrode after forming an insulation layer on a semiconductor substrate;

performing a first pre-treatment cleaning process on the gate electrode and insulation layer, and then forming a gate insulation layer having an ONO structure;

performing a steam anneal process on the ONO gate insulation layer;

removing the gate insulation layer around a node area of the semiconductor device by performing a masking and an etching processes;

performing a second pre-treatment cleaning process on the gate insulation layer and insulation layer, and then forming a channel area on a remaining area excluding the node area;

performing an SPG (Said Phase Epitaxial Growth) anneal process on the channel area, and performing a light oxidation for a surface treatment of the channel area by In-Situ; and performing a threshold voltage ion injection on the channel area, and then performing LDO (Light Doped Offset) ion injection and source/drain ion injection consecutively using respective masks on the channel area to form a pull-up transistor.

2. The method for manufacturing a thin film transistor of a semiconductor device of claim 1, wherein the insulation layer comprises an oxidation layer.

3. The method for manufacturing a thin film transistor of a semiconductor device of claim 1, wherein the gate electrode comprises a doped poly-silicon and is formed with an LP-CVD method.

4. The method for manufacturing a thin film transistor of a semiconductor device of claim 3, wherein the doped poly-silicon is made from a mixture of a silicon source gas and $PH_3$ gas.

5. The method for manufacturing a thin film transistor of a semiconductor device of claim 1, wherein the gate electrode has a thickness ranging from about 500 to about 1500 Å and is formed at a temperature ranging from about 550 to about 620° C. and under a pressure ranging from about 0.1 to about 3 torr.

6. The method for manufacturing a thin film transistor of a semiconductor device of claim 1, wherein the gate electrode is formed by an over-etching to a depth less than half of the thickness of the lower insulation layer.

7. The method for manufacturing a thin film transistor of a semiconductor device of claim 1, wherein the first pre-treatment cleaning process is performed by using a DHF solution comprising a mixture of HF and $H_2O$ diluted to a ratio ranging from about 50:1 to about 100:1 by weight.

8. The method for manufacturing a thin film transistor of a semiconductor device of claim 1, wherein the lower oxidation layer and the upper oxidation layer are formed by a thermal oxidation layer using $DCS:SiH_2Cl_2$ gas and $N_2O$ gas as sources.

9. The method for manufacturing a thin film transistor of a semiconductor device of claim 1, wherein the lower oxidation layer and the upper oxidation layer are formed by an LP-CVD method under a pressure ranging from about 0.1 to about 0.5 torr and at a temperature ranging from about 810 to about 850° C.

10. The method for manufacturing a thin film transistor of a semiconductor device of claim 1, wherein the nitride layer is formed by an LP-CVD method using $DCS:SiH_2Cl_2$ gas and $NH_3$ gas as sources.

11. The method for manufacturing a thin film transistor of a semiconductor device of claim 1, wherein the upper oxidation layer is thicker than the lower oxidation layer.

12. The method for manufacturing a thin film transistor of a semiconductor device of claim 1, wherein the steam anneal process is performed by a wet-oxidizing method at a temperature ranging from about 750 to about 790° C.

13. The method for manufacturing a thin film transistor of a semiconductor device of claim 1, wherein a ratio of thickness of the lower oxidation layer, the nitride layer, and the upper oxidation layer in the range 35~65:40~65:65~100.

14. The method for manufacturing a thin film transistor of a semiconductor device of claim 1, wherein the second pre-treatment cleaning process is performed by using PIRANHA and HF.

15. The method for manufacturing a thin film transistor of a semiconductor device of claim 1, wherein the channel area is formed by an undoped amorphous silicon layer using $Si_2H_6$ as a source gas to a thickness ranging from about 250 to about 1000 Å, with an LP-CVD method at a temperature ranging from about 460 to about 500° C. and under a pressure ranging from about 0.1 to about 2 torr.

16. The method for manufacturing a thin film transistor of a semiconductor device of claim 1, wherein the SPG anneal process is performed for a time period ranging from about 3 to about 6 hours at a temperature ranging from about 620 to about 670° C. and in a $N_2$ atmosphere.

17. The method for manufacturing a thin film transistor of a semiconductor device of claim 1, wherein the light oxidation process is performed by flowing $O_2$ gas using a dry method at a temperature ranging from about 750 to about 830° C.

18. The method for manufacturing a thin film transistor of a semiconductor device of claim 1, wherein, the threshold voltage ion injection is performed with a dose amount ranging from about $1\times10^{11}$ to about $1\times10^{13}$ ions/cm$^2$ using P and at a power ranging from about 10 to about 50 keV.

19. The method for manufacturing a thin film transistor of a semiconductor device of claim 1, wherein, the LDO ion injection is performed with a dose amount ranging from about $1\times10^{11}$ to about $1\times10^{13}$ ions/cm$^2$ using $BF_2$ and at a power ranging from about 10 to about 50 keV.

20. The method for manufacturing a thin film transistor of a semiconductor device of claim 1, wherein, the source/drain ion injection is performed with a dose amount ranging from about $1\times10^{14}$ to about $1\times10^{15}$ ions/cm$^2$ using $BF_2$ and at a power ranging from about 10 to about 50 keV.

21. A method for manufacturing a thin film transistor of a semiconductor device, comprising:

forming a gate electrode after forming an insulation layer on a semiconductor substrate;

performing a first pre-treatment cleaning process on the gate electrode and insulation layer, and then forming a lower oxidation layer;

forming a nitride layer on the lower oxidation layer;

forming an upper oxidation layer on the nitride layer to form a gate insulation layer comprised of the lower oxidation layer, the nitride layer and the upper oxidation layer;

performing a steam thermal process using a wet-oxidation method on the gate insulation layer;

removing the gate insulation layer around a node area of the semiconductor device by performing a masking and an etching processes;

performing a second pre-treatment cleaning process on the gate insulation layer and insulation layer, and then forming a channel area on a remaining area excluding the node area;

performing an SPG anneal process on the channel area, and performing a light oxidation for a surface treatment of the channel area by In-Situ; and performing a threshold voltage ion injection on the channel area, and then performing LDO ion injection and source/drain ion injection consecutively, using respective masks, on the channel area to form a pull-up transistor.

* * * * *

UNITED STATES PATENT AND TRADEMARK OFFICE
CERTIFICATE OF CORRECTION

PATENT NO. : 6,664,151 B2
DATED : December 16, 2003
INVENTOR(S) : Cha-Deok Dong et al.

It is certified that error appears in the above-identified patent and that said Letters Patent is hereby corrected as shown below:

<u>Column 4,</u>
Line 56, please delete "Said" and replace with -- Solid --.

Signed and Sealed this

Thirtieth Day of March, 2004

JON W. DUDAS
*Acting Director of the United States Patent and Trademark Office*